United States Patent [19]
Sakata

[11] Patent Number: 6,136,495
[45] Date of Patent: Oct. 24, 2000

[54] SILVER HALIDE LIGHT-SENSITIVE MATERIAL COMPRISING SUPPORT, HARDENING LAYER AND LIGHT-SENSITIVE LAYER

[75] Inventor: Kaku Sakata, Shizuoka, Japan

[73] Assignee: Fuji Photo Film Co., Ltd., Kanagawa, Japan

[21] Appl. No.: 09/348,007

[22] Filed: Jul. 6, 1999

[30] Foreign Application Priority Data

Jul. 6, 1998 [JP] Japan ................................ 10-205859

[51] Int. Cl.[7] ................ G03C 8/08; G03C 8/26; G03C 8/40; G03F 7/06
[52] U.S. Cl. ................ 430/203; 430/202; 430/205; 430/218; 430/617; 430/959; 430/273.1; 430/566
[58] Field of Search ................ 430/202, 203, 430/205, 218, 959, 617, 273.1, 566

[56] References Cited

U.S. PATENT DOCUMENTS

| | | | |
|---|---|---|---|
| 3,438,776 | 4/1969 | Yudelson | 430/203 |
| 5,843,619 | 12/1998 | Hoshi | 430/203 |
| 5,882,838 | 3/1999 | Hoshi et al. | 430/203 |

*Primary Examiner*—Richard L. Schilling
*Attorney, Agent, or Firm*—Sughrue, Mion, Zinn, Macpeak & Seas, PLLC

[57] ABSTRACT

A silver halide light-sensitive material comprises a support, a hardening layer and a light-sensitive layer in order. The hardening layer contains an ethylenically unsaturated polymerizable compound or a cross-linkable polymer. The light-sensitive layer contains silver halide and fine particles containing a reducing agent. The fine particles are made of a mixture of a reducing agent and a non-reducing compound. A melting point of the mixture is lower than a melting point of the reducing agent. The difference between the melting points is not smaller than 10° C.

7 Claims, 1 Drawing Sheet

Fig. 1

SILVER HALIDE LIGHT-SENSITIVE MATERIAL COMPRISING SUPPORT, HARDENING LAYER AND LIGHT-SENSITIVE LAYER

FIELD OF THE INVENTION

The present invention relates to a silver halide light-sensitive material comprising a support, a hardening layer, and a light-sensitive layer containing a reducing agent in the form of fine particles.

BACKGROUND OF THE INVENTION

U.S. Pat. No. 4,629,676 (Hayakawa et al) and European Patent No. 0174634 (Fuji Photo Film Co., Ltd.) disclose an image forming method comprising the steps of imagewise exposing to light a light-sensitive material and heating the light-sensitive material. The light-sensitive material comprises a support and a light-sensitive hardening layer containing silver halide, a reducing agent and a polymerizable compound. The silver halide is developed by heating the light-sensitive material to form a polymer image. The polymerization is initiated by an oxidation radical of the reducing agent (including a radical formed from an oxidation product of the reducing agent).

The above image forming method can be applied for preparing a lithographic plate. In that case, the strength of the hardened image is particularly required. In the above light-sensitive material, silver halide, a reducing agent and a polymerizable compound are incorporated in a single light-sensitive hardening layer. However, it is very difficult for the single hardening layer containing various components to give a hardened image of enough strength for a lithographic plate.

U.S. Pat. No. 5,122,443 (Takeda), U.S. Pat. No. 5,290,659 (Takeda) and European Patent No. 0426192 (Fuji Photo Film Co., Ltd.) disclose embodiments of the light-sensitive materials advantageously used for the preparation of a lithographic plate. In those materials, a light-sensitive layer containing silver halide is separated from a hardening layer containing a polymerizable compound or a cross-linkable polymer. The hardening layer or the light-sensitive layer further contains a reducing agent. In view of the strength of the hardened image, the reducing agent is preferably contained in the light-sensitive layer.

A process for the preparation of a lithographic plate comprises the steps of imagewise exposing the light-sensitive material to light, heating the material, removing the light-sensitive layer from the material, and removing the unhardened area of the hardening layer with an alkaline etching solution. The formed replica image is used as a printing plate.

SUMMARY OF THE INVENTION

A hard replica image can be obtained by separating a hardening layer from a light-sensitive layer. The obtained hard image can be used as a lithographic plate. A silver halide light-sensitive material is further studied to use the obtained image practically as the lithographic plate.

In the practical use, a latitude of a processing condition is important. The practical process is not always conducted under the optimum condition. Even if a light-sensitive material forms an image of an excellent quality under the optimum condition, the material forming an image of poor quality under other conditions can not be practically used.

One of the most important processing conditions is a temperature of heat development. The latitude of the developing temperature must be expanded for practical use. A light-sensitive material is preferably developed at a relatively low temperature.

The applicant has studied the latitude of the developing temperature, and found that the latitude can be easily expanded with a new light-sensitive material.

An object of the present invention is to provide a light-sensitive material forming a clear image at a relatively low developing temperature.

The present invention provides a silver halide light-sensitive material comprising a support, a hardening layer and a light-sensitive layer in order, said hardening layer containing an ethylenically unsaturated polymerizable compound or a cross-linkable polymer, and said light-sensitive layer containing silver halide and fine particles containing a reducing agent, wherein the fine particles are made of a mixture of the reducing agent and a non-reducing compound, said mixture having a melting point which is lower than a melting point of said reducing agent, and the difference between the melting points being not smaller than 10° C.

According to the study of the applicant, the fine particles of a reducing agent in the light-sensitive layer melt at the heat development temperature, and then function at developing reactions (development of silver halide and hardening reaction of a polymerizable compound or cross-linkable polymer) in the form of liquid. This means that the melting point of the reducing agent relates to the latitude of the heat development temperature. The heat development can be conducted at a relatively low temperature by using a reducing agent having a low melting point. However, it is difficult to adjust the melting point of the reducing agent because the molecular structure of the reducing agent is designed for the most important developing reaction.

In a single light-sensitive hardening layer containing various components, the reducing agent is in the form of a mixture with the other component. The reducing agent in the mixture melts at a temperature lower than its own melting point. Therefore, the a single light-sensitive hardening layer can form an image at a heat development temperature lower than the melting point of the pure reducing agent. This effect was not intended, but given due to the single light-sensitive hardening layer.

However, the strength of the hardened image has been required to obtain a printing plate, as is described above. Accordingly a hardening layer is separated from a light-sensitive layer. In the light-sensitive layer, particles of the reducing agent are incorporated separately from the other components. Therefore, the melting point of the particles is the same as the melting point of the reducing agent. The reducing agent in the light-sensitive layer can not melt at the temperature lower than the melting point, while the reducing agent in the single light-sensitive hardening layer can melt at the temperature.

The applicant has found that fine particles made of a mixture of a reducing agent and a non-reducing compound melt at a temperature lower than the melting point of the pure reducing agent. The latitude of the heat development temperature can be expanded by using the mixture. For the reasons mentioned above, the light-sensitive material of the present invention forms a clear image at a relatively low temperature.

DETAILED DESCRIPTION OF THE INVENTION

[Reducing agent]

The reducing agent has a function of reducing the silver halide or a function of accelerating a hardening reaction of a polymerizable compound or a cross-linkable polymer.

The reducing agents are described in Japanese Patent Provisional Publication Nos. 61(1986)-183640, 61(1986)-188535, 61(1986)-228441, 62(1987)-70836, 62(1987)-86354, 62(1987)-86355, 62(1987)-206540, 62(1987)-264041, 62(1987)-109437, 63(1988)-254442, 1(1989)-267536, 2(1990)-141756, 2(1990)-141757, 2(1990)-207254, 2(1990)-262662 and 2(1990)-269352. The reducing agents are also described in T. James, The Theory of the Photographic Process, 4th edition, pages 291 to 334 (1977), Research Disclosure, Vol. 170, No. 17029, pages 9 to 15 (June 1978), and Research Disclosure, Vol. 176, No. 17643, pages 22 to 31 (December 1978).

A molecular structure of the reducing agent comprises a reducing functional group and a hydrocarbon moiety. The molecular structure optionally comprises a non-reducing substituent group, which is attached to the hydrocarbon moiety. Examples of the reducing functional groups include hydrazine, hydrazide, phenolic hydroxyl group and sulfonamide.

Examples of the reducing agents include hydrazines, hydrazides, hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-amino-pyrimidines, reductones, aminoreductones, o- or p-sulfonamidophenols, o- or p-sulfonamidonaphthols, o- or p-amidophenols, 2-sulfonamidoindanones, 4-sulfonamido-5-pyrazolones, 3-sulfonamidoindoles, sulfonamidopyrazolobenzimidazoles, sulfonamidopyrazolotriazoles, and α-sulfonamidoke-tones. Hydrazines and hydrazides are preferred, and hydrazides are particularly preferred.

Two or more reducing agents can be used in combination. Certain interactions between those reducing agents may be expected where two or more reducing agents are used in combination. One of the interactions is for an acceleration of reduction of silver halide (or an organic silver salt) through so-called superadditivity. Another interaction is promoting (or inhibiting) a chain reaction between an oxidant of one reducing agent formed by a reduction of silver halide (or an organic silver salt) oxidation-reduction reaction and another reducing agent. The chain reaction induces the polymerization of the polymerizable compound.

The reducing agent is used in an amount of 0.1 to 10 mol, and more preferably 0.25 to 2.5 mol based on 1 mol of silver halide.

[Non-reducing compound]

The non-reducing compound is mixed with the reducing agent to form fine particles of the mixture together with the reducing agent. The melting point of the mixture is lower than the melting point of the reducing agent. The difference between the melting points is not smaller than 10° C.

For preparing the fine particles of the mixture with the reducing agent, the non-reducing compound preferably has a molecular structure similar to the structure of the reducing agent. As is described above, the reducing agent has a molecular structure consisting of a reducing functional group, a hydrocarbon moiety and an optional non-reducing substituent group, which is attached to the hydrocarbon moiety. The non-reducing compound preferably has a molecular structure similar to the structure of the reducing agent, except that the reducing functional group is removed or replaced with a non-reducing functional group. The hydrocarbon moiety of the non-reducing compound, rather than the non-reducing functional group, is preferably similar to the hydrocarbon moiety of the reducing agent.

In the case that the reducing agent has a reducing linking group, such as hydrazide (—NH—NH—CO—), hydrazine (—NH—NH—) or sulfonamide (—NH—SO$_2$—), a non-reducing compound preferably has a non-reducing linking group in place of the reducing linking group, while the hydrocarbon moiety of the non-reducing compound is the same as the moiety of the reducing agent. Examples of the non-reducing linking groups include amide (—NH—CO—), thioamide (—NH—CS—), imino (—NH—), ester (—O—CO—), ether (—O—), thioether (—S—), an alkylene group (—C$_n$H$_{2n}$—) and combinations thereof. In the case the reducing agent has a hydrazide (—NH—NH—CO—) as the reducing linking group, the non-reducing compound preferably has amide (—NH—CO—) or ester (—O—CO—) as the non-reducing linking group.

In the case that the reducing agent has a reducing terminal group such as phenolic hydroxyl group [—OH], the non-reducing compound preferably does not have the a reducing terminal group, or has a non-reducing terminal group in place of the reducing terminal group, while the hydrocarbon moiety of the non-reducing compound is the same as the moiety of the reducing agent. Examples of the non-reducing terminal groups include amino (—NH$_3$) and an alkyl group (—C$_n$H$_{2n+1}$).

Even if the non-reducing compound has a melting point higher than that of the pure reducing agent, the melting point of the mixture can be lower than that of the pure reducing agent because of melting point depression in the mixture. However, the non-reducing compound preferably has a melting point lower than that of the pure reducing agent. The difference between the melting points of the mixture and the pure reducing agent is not smaller than 10° C., preferably not smaller than 12° C., more preferably not smaller than 14° C., and further preferably not smaller than 16° C. Although the difference of the melting points is preferred to be large, it is technically restricted to about 200° C. The mixture preferably has a melting point higher than room temperature to form solid particles at room temperature.

If two or more kinds of reducing agent are used, two or more kinds of non-reducing compound (each corresponding to each of the reducing agents) are preferably used.

The non-reducing compound is preferably used in nearly the same amount as the reducing agent, namely, in an amount of 0.1 to 10 mol, more preferably 0.2 to 5 mol, further preferably 0.5 to 2 mol, and furthermore preferably 0.8 to 1.25 mol based on 1 mol of the reducing agent.

[Fine particles of reducing agent and non-reducing compound]

The fine particles consisting of a reducing agent and a non-reducing compound are preferably mixed crystals rather than an amorphous mixture. For preparing the mixed crystals, the non-reducing compound preferably has a molecular structure similar to that of the reducing agent, as described above.

The mixed crystals can be obtained, for example, through reprecipitation or recrystallization from a solution prepared by dissolving the reducing agent and the non-reducing compound in an appropriate solvent.

The particles have an average particle size preferably in the range of 0.01 to 10 μm, more preferably in the range 0.1 to 5 μm, and most preferably in the range of 0.5 to 1 μm.

The dispersion of the particles is added to the coating solution for a light-sensitive layer (described below). In the light-sensitive layer, the particles are preferably dispersed with a hydrophilic polymer (described below) as a dispersing agent.

[Layered structure]

The light-sensitive material comprises a support, a hardening layer and a light-sensitive layer in order. An overcoating layer or an image formation accelerating layer can be provided on the light-sensitive layer. The fine particles of the reducing agent and the non-reducing compound are incorporated in the light-sensitive layer.

The components of the above-mentioned layers are preferably uniformly dispersed in the layers without use of microcapsules.

The light-sensitive material may further have other optional layers such as an adhesive layer, a strippable layer, an undercoating layer, and an intermediate layer.

Figure 1:
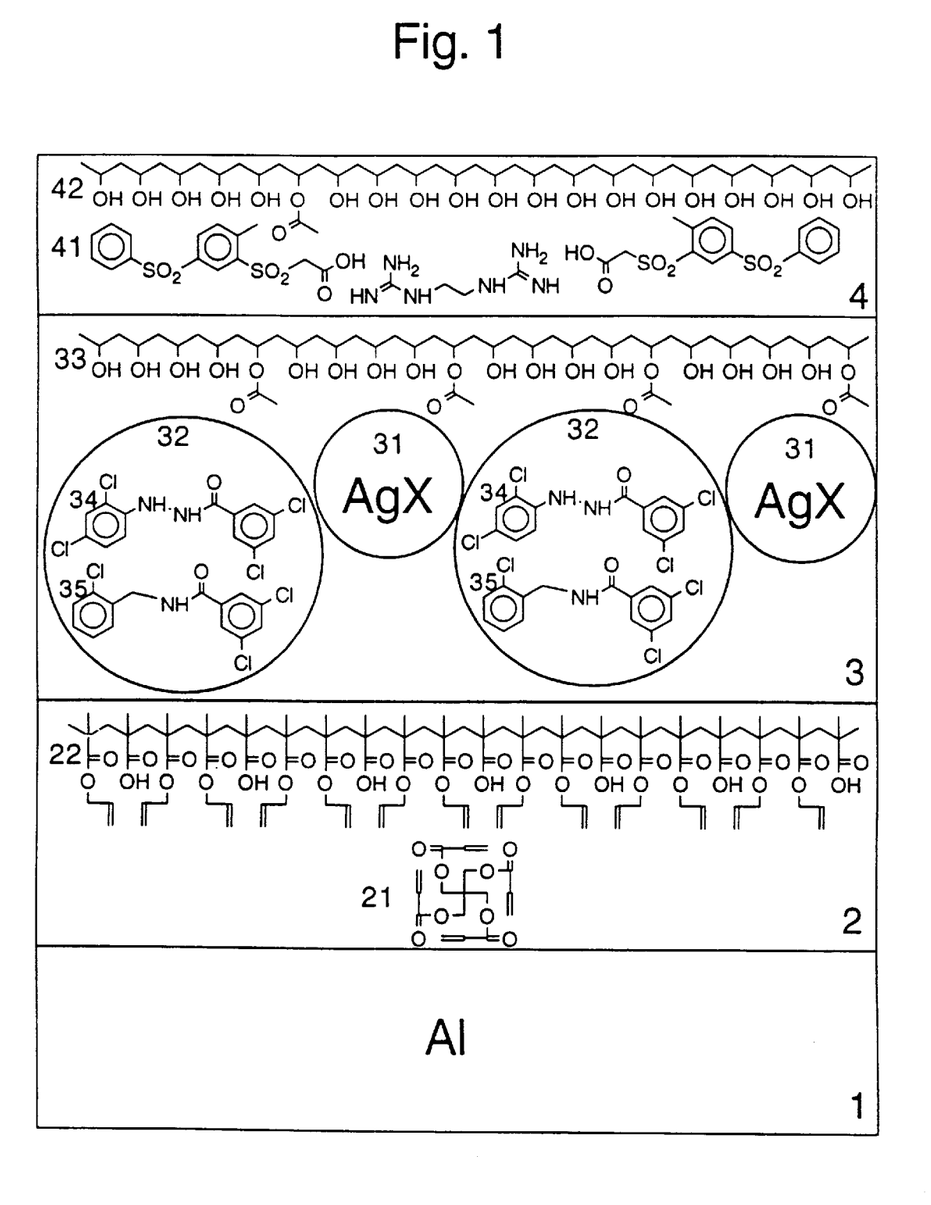
FIG. 1 is a sectional view schematically illustrating a preferred embodiment of the light-sensitive material of the invention.

FIG. 1 is a sectional view schematically illustrating a preferred embodiment of the light-sensitive material of the invention.

The light-sensitive material shown in FIG. 1 comprises an aluminum support (1), a hardening layer (2), a light-sensitive layer (3) and an image formation accelerating layer (4) in order. The hardening layer (2) contains an ethylenically unsaturated polymerizable compound (21) and a cross-linkable polymer (22). The light-sensitive layer (3) contains silver halide (31), fine particles (32) consisting of a reducing agent (34) and a non-reducing compound (35), and a hydrophilic polymer (33). The image formation accelerating layer (4) contains a base precursor (41) and a hydrophilic polymer (42).

[Support]

The support can be made of a paper, a synthetic paper, a paper laminated with a synthetic resin (e.g., polyethylene, polypropylene, polystyrene), a plastic (e.g., polyethylene terephthalate, polycarbonate, polyimide, Nylon, cellulose triacetate) film, a metal (e.g., aluminum, aluminum alloy, zinc, iron, copper) plate or a paper or plastic film laminated with the metal. Further, the metal can be evaporated onto the paper or plastic film to form the support.

In the case where the light-sensitive material is used for the preparation of a lithographic plate, the support is preferably made of an aluminum plate, a polyethylene terephthalate film, a polycarbonate film, a paper or a synthetic paper. A complex sheet can be also used as the support. For example, an aluminum sheet can be laminated on the polyethylene terephthalate film. An aluminum support is particularly preferred, and hence it is described below in detail.

The aluminum support is preferably treated to form a rough surface (graining treatment) or a hydrophilic surface.

The treatment for the rough surface can be conducted by an electrochemical graining treatment and/or a mechanical graining treatment. According to the electrochemical graining treatment, a current passes through an aluminum plate in an electrolytic solution of hydrochloric acid or nitric acid. The mechanical graining treatment includes a wire brushing method, a ball graining method and a brush graining method. In the wire brushing method, the surface of aluminum plate is scratched with a metal wire. In the ball graining method, the surface of aluminum plate is grained with graining balls and a graining agent. In the brush graining method, the surface is grained with a nylon brush and a graining agent.

The grained aluminum plate is then chemically etched with an alkali or an acid. An alkali etching method is industrially advantageous. Examples of the alkali agents indude sodium carbonate, sodium aluminate, sodium metasilicate, sodium phosphate, sodium hydroxide, potassium hydroxide and lithium hydroxide. The alkali solution preferably has a concentration in the range of 1 to 50 wt. %. The temperature of the alkali treatment is preferably in the range of 20 to 100° C. The treatment conditions are preferably adjusted so that the amount of the dissolved aluminum is in the range of 5 to 20 g per m$^2$.

The aluminum plate is usually washed with an acid to remove smut from the surface after the alkali etching treatment. Examples of the acids include nitric acid, sulfuric acid, phosphoric acid, chromic acid, hydrofluoric acid and borofluoric acid.

The smut removing treatment can also be conducted according to a conventional method after the electrochemical graining treatment. For example, an aluminum plate can be treated with 15 to 65 wt. % sulfuric acid at a temperature in the range of 50 to 90° C.

The surface treated aluminum plate can be subjected to an anodizing treatment or a chemical treatment. The anodizing treatment can be conducted according to a conventional method. In more detail, a direct or alternative current passes through an aluminum plate in a solution of an acid to form an anodic oxide layer on the surface of the plate. Examples of the acids include sulfuric acid, phosphoric acid, chromic acid, oxalic acid, sulfamic acid and benzenesulfonic acid. The conditions of the anodizing treatment depend on the contents of the electrolytic solution. The concentration of the electrolytic solution is preferably in the range of 1 to 80 wt. %, the temperature of the solution is preferably in the range of 5 to 70° C., the current density is preferably in the range of 0.5 to 60 A/dm$^2$, the voltage is preferably in the range of 1 to 100 v, and the time for the electrolysis is preferably in the range of 10 to 100 seconds.

The anodizing treatment is preferably conducted in sulfuric acid at a high current density. Phosphoric acid is also preferably used for the anodizing treatment.

After the anodizing treatment, the aluminum plate can be treated with an alkali metal silicate. For example, the aluminum plate can be immersed in an aqueous solution of sodium silicate. An undercoating layer can be provided on the aluminum support to improve the adhesion between the support and the hardening layer or to improve a printing character.

[Undercoating layer]

An undercoating layer can be provided on not only the above-mentioned aluminum support, but also a support having a not sufficiently hydrophilic surface (e.g., a polymer film) as a hydrophilic layer.

Examples of the components of the undercoating layer include a polymer (e.g., gelatin, casein, polyvinyl alcohol, ethyl cellulose, phenol resin, styrene-maleic anhydride resin, polyacrylic acid), an amine (e.g., monoethanol amine, diethanol amine, triethanol amine, tripropanol amine) and a salt thereof (e.g., chloride, oxalate, phosphate), an monoaminomonocarboxylic acid (e.g., aminoacetic acid, alanine), an oxyamino acid (e.g., serine, threonine, dihydroxyethylglycine), a sulfur-containing amino acid (e.g., cysteine, cystine), a monoaminodicarboxylic acid (e.g., aspartic acid, glutamic acid), a monoaminomonocarboxylic acid (e.g., lysine), an aromatic amino acid (e.g., p-hydroxylphenylglycine, phenylalanine, anthranilic acid), an aliphatic aminosulfonic acid (e.g., sulfamic acid, cyclohexylsulfamic acid) and a (poly)aminopolyacetic acid (e.g., ethylenediaminetetraacetic acid, nitrilotriacetic acid, iminodiacetic acid, hydroxyethyliminodiacetic acid, hydroxyethylethylenediamineacetic acid, ethylenediaminediacetic acid, cycloethylenediaminetetraacetic acid, diethylenetriaminepentaaceitic acid, glycoletherdiaminetetraacetic acid). All or a part of the acidic groups of the above-mentioned compound may form a salt (e.g., sodium salt, potassium salt, ammonium salt). Two or more components can be used in combination.

In the case where a polymer film is used as a support, hydrophilic fine particles (e.g., silica particles) are preferably added to a hydrophilic undercoating layer in place of the graining treatment of an aluminum support.

[Hardening layer]

The hardening layer contains an ethylenically unsaturated polymerizable compound or a cross-linkable polymer, and preferably contains both of them.

The amount of the polymerizable compound is preferably in the range of 3 to 200 wt. %, and more preferably in the range of 10 to 100 wt. % based on the amount of the polymer.

The amount of the polymer is preferably in the range of 30 to 95 wt. %, and more preferably in the range of 50 to 90 wt. % based on the total weight of the hardening layer.

The hardening layer preferably has a thickness of 0.1 to 20 $\mu$m, and more preferably 0.3 to 7 $\mu$m.

[Adhesive layer]

The adhesive layer may be provided to improve adhesion between the hardening (hydrophobic) layer and the light-sensitive (hydrophilic) layer. The adhesive layer preferably contains a hydrophilic polymer (described below) as a binder.

The coating amount of the adhesive layer is preferably in the range of 0.01 to 2.5 g per m$^2$, more preferably in the range of 0.02 to 2.0 g per m$^2$, and most preferably in the range of 0.05 to 1.5 g per m$^2$.

[Light-sensitive layer]

The light-sensitive layer contains silver halide and the above-described fine particles consisting of a reducing agent and a non-reducing compound.

The coating amount of silver halide is preferably in the range of 0.01 to 5 g per m$^2$, more preferably in the range of 0.03 to 1 g per m$^2$, and most preferably in the range of 0.05 to 0.3 g per m$^2$.

The light-sensitive layer preferably has a thickness of 0.07 to 13 $\mu$m, and more preferably 0.2 to 5 $\mu$m.

[Overcoating layer and image formation accelerating layer]

An overcoating layer has a function of preventing oxygen in the air from permeating into the hardening layer. Oxygen functions as a polymerization inhibitor. The overcoating layer can also function as a protective layer. The overcoating layer can further function as an image formation accelerating layer, which contains a component (e.g., a base, a base precursor, a reducing agent, a heat development accelerator) that accelerates an image forming reaction.

The overcoating layer or the image formation accelerating layer preferably has a thickness of 0.3 to 20 $\mu$m, more preferably 0.5 to 7 $\mu$m.

[Intermediate layer]

An intermediate layer can be provided between the layers.

The intermediate layer can function as an antihalation layer, a filter layer or a barrier layer. The antihalation layer or the filter layer is a functional layer containing a dye. The barrier layer prevent s components from moving between layers when the light-sensitive material is stored. The composition of the intermediate layer is determined according to its function.

The intermediate layer preferably has a thickness of not less than 10 $\mu$m.

[Silver halide]

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. Irregular forms and mixed forms as well as the above mentioned regular forms can be used in the silver halide emulsions. Examples of the ir-regular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 $\mu$m. The grains may also be relatively large grains having a diameter of more 10 $\mu$m. A monodispersed emulsion is preferred to a polydispersed emulsion. The monodispersed emulsion is described in U.S. Pat. Nos. 3,574,628, 3,655,394 and British Patent No. 1,413,748.

With respect to the crystal structure of the silver halide grains, the individual grains have a homogeneous halogen composition or a heterogeneous halogen composition. In the heterogeneous composition, the composition varies from the outer surface portion to the inside portion. The grains may have a multi-layered structure. Further, the silver halide grains may be conjugated with other silver halide grains having different halogen composition through epitaxial conjugation. The grains may be conjugated with compounds other than the silver halide such as silver rhodanate and lead oxide.

Various substances in the form of salt can be added to the silver halide grains. Examples of the substances include copper, thallium, lead, cadmium, zinc, chalcogens (e.g., sulfur, selenium, tellurium), gold, and noble metals of group VIII (e.g., rhodium, iridium, iron, platinum, palladium). The salts are added to the emulsion at the grain formation or after the grain formation according to a conventional process. The conventional process is described in U.S. Pat. Nos. 1,195,432, 1,951,933, 2,448,060, 2,628,167, 2,950,972, 3,488,709, 3,737,313, 3,772,031, 4,269,927 and Research Disclosure (RD), No. 13,452 (June 1975).

The silver halide grains can be doped with iridium ion by adding an aqueous solution of an iridium compound to a silver halide emulsion. Examples of water-soluble iridium compounds include hexachloroiridic(III) salts and hexachloroiridic(IV) salts. The silver halide grains can also be doped with rhodium ion by adding an aqueous solution of a rhodium compound to a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide.

Two or more kinds of silver halide grains that differ in halogen composition, crystal habit, grain size, or other features from each other can be used in combination.

The silver halide is preferably used in the form of an emulsion. The silver halide emulsion can be prepared by known processes, which are described in Research Disclosure (RD), No. 17,643, pages 22 to 23 (December 1978), (Emulsion preparation and types); and Research Disclosure, No. 18,716, page 648, (November 1979).

The silver halide emulsion is generally used after a physical ripening and a chemical sensitization. The silver halide grains preferably have a low fogging value.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

The spectral sensitizing dyes can be used to adjust the spectral sensitivity of the light-sensitive material to wavelength of two or more light sources such as various laser beams (e.g., semiconductor laser, helium neon laser, argon ion laser, helium cadmium laser, YAG laser) and a light emission diode. For example, two or more sensitizing dyes are used for silver halide grains in a light-sensitive layer so that a light-sensitive material can be exposed to two or more light sources.

A supersensitizer can be added to the emulsion in addition to the sensitizing dye. The supersensitizer itself has neither a spectral sensitization effect nor an absorption of visible light, but shows a supersensitizing effect on the sensitizing dye.

The spectral sensitizing dyes are described in Research Disclosure No. 17,643 (December 1978), pages 23 to 24. The supersensitizers are described in Research Disclosure No. 18,716 (November 1979), page 649.

[Organic metallic salt]

An organic metallic salt can be added to the light-sensitive layer containing silver halide. An organic silver salt is particularly preferred.

Examples of organic moieties of the salts include triazoles, tetrazoles, imidazoles, indazoles, thiazoles, thiadiazoles, azaindenes. An aliphatic, aromatic or heterocyclic compound having a mercapto group can also be used as the organic moiety. Further, silver carboxylates and acetylene silver can be used as the organic silver salt. Two or more organic metallic salts can be used in combination.

The organic silver salt is generally used in an amount of $10^{-5}$ to 10 mol, and preferably $10^{-4}$ to 1 mol based on 1 mol of silver halide.

[Antifogging agent, silver development accelerator, stabilizer]

The light-sensitive material can contain an antifogging agent, a silver development accelerator or a stabilizer. They may be incorporated in any layers of the material. Examples of these compounds include mercapto compounds (described in Japanese Patent Provisional Publication No. 59(1984)-111636), azoles or azaindenes (described in Research Disclosure No. 17,643 (1978), pages 24 to 25), nitrogen-containing carboxylic acids or the phosphoric acids (described in Japanese Patent Provisional Publication No. 59(1984)-168442), cyclic amides (described in Japanese Patent Provisional Publication No. 61(1986)-151841), thioether (described in Japanese Patent Provisional Publication No. 62(1986)-151842), polyethylene glycol derivatives (described in Japanese Patent Provisional Publication No. 62(1987)-151843), thiol (described in Japanese Patent Provisional Publication No. 62(1986)-151844), acetylene compounds (described in Japanese Patent Provisional Publication No. 62(1987)-87957) and sulfonamides (described in Japanese Patent Provisional Publication No. 62(1987)-178232).

An aromatic (a carbon or heterocyclic ring) mercapto compound can also be used as an antifogging agent or a silver development accelerator. An aromatic heterocyclic mercapto compound, particularly a mercapto triazole derivative is preferred. The mercapto compound can be used in the form of a mercapto silver (silver salt).

The above compounds are generally used in an amount of $10^{-7}$ to 1 mol based on 1 mol of the silver halide.

[Hydrophilic polymer]

A hydrophilic polymer is used as a binder of a hydrophilic layer, such as a light-sensitive later, an adhesive layer, an overcoating layer and an intermediate layer.

The hydrophilic polymer has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

Natural or synthetic polymers can be used as the hydrophilic polymer. The hydrophilic polymers are described in Japanese Patent Provisional Publication No. 5(1993)-249667.

Polyvinyl alcohol is a particularly preferred hydrophilic polymer. Polyvinyl alcohol preferably has a high saponification degree of not lower than 70%, and more preferably of not lower than 80%.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, vinyl higher carboxylate, a higher alkyl vinyl ether, methyl methacrylate and acrylamide.

Polyvinyl alcohol may also be denatured after the saponification. Hydroxyl in polyvinyl alcohol can be modified by etheration, esterification or acetylation.

A cross-linked polyvinyl alcohol can also be used. Examples of the cross-linking agents include aldehydes, methylol compounds, epoxy compounds, diisocyanates, divinyl compounds, dicarboxylic acids and inorganic cross-linking agents (e.g., boric acids).

The molecular weight of the hydrophilic polymer is preferably in the range of 3,000 to 500,000.

[Ethylenically unsaturated olymerizable compound]

The ethylenically unsaturated polymerizable compound (monomer or oligomer) has an ethylenically unsaturated group polymerizable with a free radical. The ethylenically unsaturated polymerizable compounds are described in Japanese Patent Provisional Publication No. 5(1993)-249667.

Examples of the ethylenically unsaturated polymerizable compounds include acrylic acids, salts thereof, acrylic esters, acrylamides, methacrylic acids, salts thereof, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Acrylic esters and methacrylic esters are preferred. Examples of the (meth)acrylic esters include pentaerythritol tetra(meth)acrylate, trimethylolpropane tri-(meth)acrylate, dipentaerythritol hexa(meth)acrylate, polyester (meth) acrylate and polyurethane (meth)acrylate.

Two or more ethylenically unsaturated polymerizable compounds can be used in combination.

[Cross-linkable polymer]

A cross-linkable polymer preferably has a cross-linkable ethylenically unsaturated bond. The cross-linkable functional group can be introduced into the main chain or side chain of the polymer molecule. The cross-linkable functional group can also be introduced into the polymer by copolymerization.

Examples of the polymer having an ethylenically unsaturated bond in its main chain include poly-1,4-butadiene, poly-1,4-isoprene and natural or synthetic rubbers. Examples of the polymer having an ethylenically unsaturated bond in its side chain include polymers of acrylic or methacrylic ester or amide having a specific residue, which means R of —COOR (ester) or —CONHR (amide). Examples of the specific residues include —$(CH_2)_n$—$CR^1$↑$CR^2R^3$, —$(CH_2O)_n$—$CH_2CR^1$=$CR^2R^3$, —$(CH_2CH_2O)_n$—$CH_2CR^1$=$CR^2R^3$, —$(CH_2)_n$—NH—CO—O—$CH_2CR^1$=$CR^2R^3$, —$(CH_2)_n$—O—CO—$CR^1$=$CR^2R^3$ and —$(CH_2CH_2O)_n$—X. In the formulas, each of $R^1$, $R^2$ and $R^3$ independently is hydrogen, a halogen atom, an alkyl group, an aryl group, an alkoxy group and aryloxy group. The number of the carbon atoms contained in $R^1$, $R^2$ or $R^3$ is not more than 20. $R^1$ and $R^2$ or $R^3$ may be combined to form a ring. In the formulas, n is an integer of 1 to 10. X is dicyclopentadienyl.

Examples of the ester residues include —$CH_2CH$=$CH_2$ (described in Japanese Patent Publication No. 7(1995)-21633), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$ and —$CH_2CH_2O$—X (wherein X is dicyclopentadienyl). Examples of the amide residues include —$CH_2CH$=$CH_2$, —$CH_2CH_2$—1—Y (wherein Y is cyclohexene) and —$CH_2CH_2$—OCO'CH=$CH_2$.

The cross-linkable polymer is hardened by adding a free radical to the unsaturated bond (or group). The free radical functions as a polymerization initiator or a chain extender. The polymers are cross-linked with each other directly or by a chain reaction of a polymerizable compound. The polymer can also be cross-linked by a reaction of polymer radicals, which are formed by detaching an atom of the polymers (e.g., hydrogen attached to carbon adjacent to the unsaturated bond) by a free radical.

Non-cross-linkable (or weak cross-linkable) polymers may be used in addition to (or in place of) the cross-linkable polymer.

Examples of non-cross-linkable polymers include polyacrylic esters, polymethacrylic esters (e.g., polymethyl methacrylate, polybenzyl methacrylate), polyacrylamides and polymethacrylamides. These polymers have a saturated aliphatic residue or an aromatic residue in place of the above-mentioned ethylenically unsaturated residue (R).

Other examples of non-cross-linkable polymers include polyvinyl acetate, polyvinyl chloride, polyvinylidene chloride, polyacrylonitrile, polymethacrylonitrile, polyethylene, polyvinyl pyridine, polyvinyl imidazole, polyvinyl butyral, polyvinyl formal, polyvinyl pyrrolidone, chlorinated polyethylene, chlorinated polypropylene, polyesters, polyamides, polyurethanes, polycarbonates, cellulose ether (e.g., ethyl cellulose) and cellulose esters (e.g., triacetyl cellulose, diacetyl cellulose, cellulose acetate butyrate).

An acidic group is preferably introduced into the above-mentioned hydrophobic (cross-linkable or non-cross-linkable) polymer. Examples of the acidic functional groups include carboxyl, an acid anhydride group, phenolic hydroxyl, sulfo, sulfonamido and sulfonimido. Carboxyl group is particularly preferred. The acidic functional groups can be introduced into the polymer by copolymerization with an acidic monomer. Examples of the acidic monomers include acrylic acid, methacrylic acid, styrenesulfonic acid and maleic anhydride. The amount of the monomer having the acidic functional group is preferably in the range of 1 to 60 mol %, more preferably in the range of 5 to 50 mol %, and further preferably in the range of 10 to 40 mol %.

The molecular weight of the hydrophobic polymer is preferably in the range of 1,000 to 500,000. Two or more polymers may be used in combination.

[Base or base precursor]

The light-sensitive material preferably contains a base or base precursor.

Various organic or inorganic bases and their precursors (e.g., decarboxylation type, thermal decomposition type, reaction type, complex salt-formation type, dissociation type) can be used in the light-sensitive material. A base precursor is preferred to a base in view of stability of the light-sensitive material.

An example of the decarboxylation type base precursor is a salt of an organic acid with a base that is decarboxylated under heating (described in Japanese Patent Provisional Publication Nos. 59(1984)-180537, 61(1986)-313431, 63(1988)-316760, 64(1989)-68746). An example of the thermal decomposition type base precursor is a urea compound (described in Japanese Patent Provisional Publication No. 63(1988)-96159). An example of the reaction type base precursor is a transition metal acetylide (described in Japanese Patent Provisional Publication No. 63(1998)-25208). An example of the complex salt-formation type base precursor is a water-insoluble basic metal compound (described in Japanese Patent Provisional Publication No. 1(1989)-3282). An example of the dissociation type base precursor is an alkali metal salt of an organic acid (e.g., sodium acetate, sodium salt of a polymer having an acidic group).

The base precursor preferably releases a base at a temperature in the range of 50 to 200° C., and more preferably in the range of 80 to 160° C.

The base or the base precursor is preferably used in an amount of preferably 0.1 to 20 mol, and more preferably 0.2 to 10 mol based on 1 mol of silver halide.

[Heat development accelerator]

The light-sensitive material can contain a heat development accelerator. The heat development accelerator may be added to any layers of the light-sensitive material. The heat development accelerator has a function of increasing the plasticity of a polymer (contained in the hardening layer or the light-sensitive layer). The accelerator has another function of accelerating the dispersion of the components in the layers when it is dissolved by heat of the development process.

The heat development accelerator has been known as a plasticizer. The known plasticizers are described in Plastic Additives (written in Japanese), pages 21 to 63 (Taisei-sha); Plastics Additives, Second Edition; Hanser Publishers, Chapter 5, pages 251 to 296.

Examples of the heat development accelerators include polyethers (e.g., polyethylene glycol, polypropylene glycol), polyhydric alcohols (e.g., glycerol, hexanediol), saccharides (e.g., sorbitol), formic esters, ureas (e.g., urea, diethylurea, ethyleneurea), amides (e.g., acetamide, propionamide, malonamide), sulfonamides, urea resins and phenol resins. Two or more heat development accelerators can be used in combination. The heat development accelerators can be added to two or more layers of the light-sensitive material.

The amount of the heat development accelerator is preferably in the range of 0.05 to 2 g per $m^2$, and more preferably in the range of 0.1 to 1 g per $m^2$.

[Colorant]

The light-sensitive material can contain a colorant. The colorant can function as an antihalation or antiirradiation dye. Further, a hardened image can be colored with the colorant. Various known dyes and pigments can be used as the colorant provided that the colorant does not affect the sensitivity and the developing reaction of silver halide. The hue of the antihalation or antiirradiation dye is preferably adjusted within the sensitive light region of silver halide.

The colorants (dyes, pigments, colloidal silvers) are described in various publications such as Japanese Patent Provisional Publication No. 5(1993)-249667, Handbook of Color Index and New Handbook of Pigments, Nippon Ganryo Gi-jutsu Kyokai (1970).

The antiirradiation dyes having little effects on the sensitivity of silver halide are described in Japanese Patent Publication Nos. 41(1966)-20389, 43(1968)-3504, 43(1968)-13168, Japanese Provisional Publication No. 2(1990)-39042, U.S. Pat. Nos. 3,423,207, 3,697,037, and British Patent Nos. 1,030,392, 1,100,546.

The amount of the colorant is preferably in the range of 0.01 to 2 g per $m^2$, and more preferably in the range of 0.05 to 1 g per $m^2$.

[Development stopping agent]

The development stopping agent can be used in the light-sensitive material to obtain a clear image constantly regardless of the temperature and time for the development process. The development stopping agent can be a compound having a function of neutralizing a base or reacting with a base to reduce the base concentration in the layer to stop development. The agent can also be a compound having a function of mutually reacting with silver or a silver salt to suppress development, after the appropriate development.

Examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. The development stopping agents are described in Japanese Patent Provisional Publication Nos. 62(1987)-253159, 2(1990)-42447 and 2(1990)-262661.

[Surface active agent]

A surface active agent can be added to a layer of the light-sensitive material. Various nonionic, anionic, cationic or fluorine surface active agents can be used. The surface active agent is described in Japanese Patent Provisional Publication No. 2(1990)-195356. Sorbitan, polyoxyethylene and a fluorine-containing compound are preferred.

[Matting agent]

A matting agent can be added to a back layer or an overcoating layer to prevent adhesion between two light-sensitive materials when the materials are superposed.

Inorganic or organic solid particles can be used as the matting agent. Examples of the matting agents include oxides (e.g., silicon dioxide), alkali earth metal salts, natural polymers (e.g., starch, cellulose) and synthetic polymers.

The average particle size of the matting agent is preferably in the range of 0.5 to 50 $\mu$m. The amount of the matting agent is preferably in the range of 0.1 to 1 g per $m^2$.

[Polymerization inhibitor]

A polymerization inhibitor can be added to the polymerizable layers to prevent a polymerization reaction while storing the light-sensitive material. Examples of the polymerization inhibitors include nitrosoamines, ureas, thioureas, thioamides, phenols and amines.

[Exposing step]

The light-sensitive material is imagewise exposed to light.

The wavelength of the light corresponds to the spectral sensitivity of silver halide. The wavelength is usually within the visible, near ultraviolet and near infrared regions. A X-ray and an electron bean can also be used as the light.

Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser, YAG laser), light emitting diode and cathode-ray tube.

The amount of the exposure is usually in the range of 0.001 to 1,000 $\mu$J per $cm^2$, and preferably in the range of 0.01 to 100 $\mu$J per $cm^2$. The light-sensitive material can be exposed to light through a transparent support.

The exposure of silver halide (namely, formation of a latent image) is influenced with the temperature and humidity at the exposing step. Accordingly, the sensitivity depends on the temperature and humidity. Therefore, the temperature and the humidity under the circumstances of the light source and the light-sensitive material are preferably controlled at constant values. An image recording apparatus having a controlling device is disclosed in Japanese Patent Provisional Publication Nos. 3(1991)-63143 and 3(1991)-63637.

[Developing step]

The light-sensitive material is developed simultaneously with or after the exposing step. The light-sensitive material is preferably heated to develop the silver halide.

The heat development can be conducted by placing the light-sensitive material on a heated material (e.g., metal plate, block, roller). The light-sensitive material may be immersed in a heated liquid for the development. Further, the light-sensitive material may be irradiated with an infrared ray.

The surface of the light-sensitive material may be open to the air while heating the material from the side of the support. The surface of the light-sensitive material may be covered with the heating means to prevent the air from penetrating into the layers. In the case where the surface is open to the air, a layer of the light-sensitive material preferably contains a polymer having a function of prevent the air from penetrating into the layers.

The heating temperature is preferably in the range of 60 to 200° C., and more preferably in the range of 100 to 160° C. The heating time is preferably in the range of 1 to 180 seconds, and more preferably in the range of 5 to 60 seconds.

A preheat treatment or post-heat treatment can be conducted before or after the heat development, respectively. The temperature of the preheat is lower than the heat development temperature, and the time is shorter than the development time. The post-heat treatment can be conducted after the image is formed, for example, after removing the unhardened hardening layer.

[Removing step]

The unhardened area can be selectively removed to form a polymer image based on a difference in the solubility between the hardened area and the unhardened area. Before the removing step, hydrophilic layers (light-sensitive layer, adhesive layer, image formation accelerating layer) are preferably removed from the light-sensitive material.

The light-sensitive material is immersed in a solvent (an etching solution) to conduct the removing step. An alkaline solution is preferably used as the solvent.

Examples of the alkaline compound include sodium hydroxide, potassium hydroxide, sodium carbonate, sodium silicate, potassium silicate, sodium metasilicate, potassium metasilicate, sodium phosphate, potassium silicate, ammonia and aminoalcohols (e.g., monoethanolamine, diethanolamine, triethanolamine).

The solvent preferably is water. An organic solvent can be used in combination with water. An alcohol and an ether are preferably used as the organic solvent. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols described above as the alkaline compounds. Examples of the ethers are cellosolves.

The solvent may further contain the other additives such as a surface active agent and a defoaming agent.

[Use of light-sensitive material]

The silver halide light-sensitive material can be used to prepare a hard copy, a relief image or a printing plate. In particular, the light-sensitive material of the present invention is advantageously used for the preparation of a printing plate.

EXAMPLE 1

Preparation of aluminum support

A surface of an aluminum plate (according to JIS-A-1050) having the thickness of 0.24 mm was ground using a nylon brush and an aqueous suspension of pumice stone of 400 mesh. The plate was well washed out with water. The aluminum plate was then immersed for etching in 10 wt. % aqueous solution of sodium hydroxide at 70° C. for 60 seconds. The plate was washed out with running water, then neutralized with 20 wt. % aqueous solution of nitric acid and washed out with water.

The obtained aluminum plate was subjected to an electrolytic surface-roughening treatment in 1 wt. % aqueous solution of nitric acid containing 0.5 wt. % aluminum nitrate in an anodically electric amount of 160 coulomb per dm² using sine wave alternating-corrugated current under such conditions as an anodic voltage of 12.7 V and a cathodically electric amount ratio to an anodically electric amount of 0.9. The center line average height (Ra) of the aluminum plate was 0.6 μm.

The aluminum plate was immersed in 1 wt. % aqueous solution of sodium hydroxide at 40° C. for 30 seconds. The plate was then immersed in 30 wt. % sulfuric acid at 55° C. for 1 minute. Further, the plate was subjected to anodizing treatment in 20 wt. % aqueous solution of sulfuric acid at a current density of 2 A per dm² to form an anodic oxide layer having the thickness of 2.5 g per dm². The plate was washed with water and dried to obtain an aluminum support.

Preparation of pigment dispersion

The following components were mixed and dispersed by means of a dynomill dispersing device at 300 rpm for 1 hour at 45° C., to prepare a pigment dispersion (average particle size: 0.10 μm).

| Pigment dispersion | |
| --- | --- |
| Copper phthalocyanine | 15 g |
| Allyl methacrylate/methacrylic acid copolymer (copolymerization ratio = 80/20) | 15 g |
| Methyl ethyl ketone | 40 g |

Formation of hardening layer

The following coating solution was coated and dried on the support to form a hardening layer having the dry thickness of 1.8 μm.

| Coating solution of hardening layer | |
| --- | --- |
| Pentaerythritol tetraacrylate | 2.5 g |
| Propylene glycol monomethyl ether solution of allyl methacrylate/methacrylic acid copolymer (20 wt. %, copolymerization ratio = 80/20) | 37.5 g |
| The above pigment dispersion | 13.0 g |
| Methyl ethyl ketone | 74.0 g |

Preparation of silver halide emulsion

Gelatin, potassium bromide and water were placed in a vessel and adjusted to pH 9.5 at the room temperature. After the mixture in the vessel was heated to 55° C., the following thioether compound ($2.0 \times 10^{-3}$ mol based on the total amount of silver nitrate) was added to the vessel. Further, an aqueous solution of silver nitrate and an aqueous solution of potassium bromide containing a rhodium ammonium chloride (the molar ratio of rhodium to the total amount of potassium iodide and silver nitrate is $4 \times 10^{-8}$ mol) were added to the vessel according to a pAg controlled double jet method while keeping the pAg of 9.0 in the reaction vessel, to prepare a silver iodobromide emulsion. The emulsion was adjusted to pH 6.0 using sulfuric acid. Further, a potassium bromide solution containing hexachloroiridate(III) salt (the molar ratio of iridium to silver is $5 \times 10^{-7}$ mol) was twice added to the emulsion at 55° C. and pAg 8.6 according to a double jet method to obtain a core-shell type silver iodobromide emulsion having the following composition.

(Thioether compound)

Core: Silver iodobromide (silver iodide content: 8.5 mol %)

Shell: Pure silver bromide

Core/shell: 3/7 (molar ratio of silver)

Average silver iodide content: 2.55 mol %

Average grain size: 0.30 μm

The grains of the obtained emulsion were monodispersed. In the emulsion, 98% (number) of the grains have a grain size within the range of the average grain size ±40%.

After the emulsion was desalted, a methanol solution of the following sensitizing dye A ($5 \times 10^{-3}$ mol per 1 liter) and a methanol solution of the following sensitizing dye B ($5 \times 10^{-3}$ mol per 1 liter) were added to the emulsion in each amount of 100 ml per 1 mol of silver nitrate. The emulsion was adjusted to pH 6.2 and pAg 8.7, and sensitized with sodium thiosulfate and chloroauric acid to prepare a silver halide emulsion.

(Sensitizing agent A)

(Sensitizing agent B)

N(C₂H₅)₃

Preparation of mixture of reducing agent and non-reducing compound

In a 400 ml ball mill container made of agate, 52.67 g of the following reducing agent and 47.33 g of the non-reducing compound (1) were placed together with 20 agate balls (diameter: 15 mm), and then stirred by means of the ball mill for 3 hours to prepare a mixture of the reducing agent and the non-reducing compound.

(Reducing agent)

(Non-reducing compound 1)

(Melting point: 141° C., Melting point of Mixture: 126° C.)

Measurement of melting point

The melting points of the pure reducing agent, the pure non-reducing compound (1), and the mixture thereof were measured by means of a differential thermal analyzer of scanning type (DSC), and found 176° C., 141° C., and 126° C., respectively. Namely, the melting point depression was 50° C.

Preparation of mixture dispersion

In 80 g of 3 wt. % aqueous solution of polyvinyl alcohol (PVA-40S, Kuraray Co., Ltd.), 20 g of powder of the above mixture was dispersed by using a dynomill dispersing device. The average particle size of the mixture was 0.8 μm.

Formation of light-sensitive layer

The following coating solution was prepared, applied and dried on the hardening layer to form a light-sensitive layer having the dry thickness of 2.0 μm.

| Coating solution of light-sensitive layer | |
|---|---|
| 10 Wt. % aqueous solution of polyvinyl alcohol having the saponification degree of 79.5% (PVA-405, Kuraray Co., Ltd.) | 7.1 g |
| The above silver halide emulsion | 0.4 g |
| The above dispersion of the mixture | 0.9 g |

| Coating solution of light-sensitive layer | |
|---|---|
| The following nitrogen-containing heterocyclic compound | 0.2 g |
| The following surface active agent | 0.2 g |
| Water | 7.8 g |

(Nitrogen-containing heterocyclic compound)

(Surface active agent)

Preparation of base Precursor dispersion

In 750 g of 3 wt. % aqueous solution of polyvinyl alcohol (Kuraray Co., Ltd.), 250 g of powder of the following base precursor was dispersed by using a dynomill dispersing device. The particle size of the base precursor was not larger than about 0.5 μm.

(Base precursor)

Formation of image formation accelerating layer

The following coating solution was prepared, applied and dried on the light-sensitive layer to form an image formation accelerating layer having the dry thickness of 3.5 μm.

| Coating solution of image formation accelerating layer | |
|---|---|
| 10 Wt. % aqueous solution of polyvinyl alcohol having the saponification degree of 98.5% (PVA-105, Kuraray Co., Ltd.) | 200.0 g |
| The above base precursor dispersion | 1.25 g |

-continued

| Coating solution of image formation accelerating layer | |
|---|---|
| 5 Wt. % aqueous solution of the above surface active agent | 4.0 g |

Thus, a light-sensitive material of the invention was produced.

[Evaluation of light-sensitive material]

The light-sensitive material was wholly exposed to laser beams of a red semiconductor laser (Crecsent 3030R, Garbor) in an amount of 2 μJ/cm².

For conducting thermal development, the light-sensitive material was placed on a hot plate so that the aluminum support might be in contact with the hot plate, and conveyed on the plate to heat the material for 30 seconds. The development was repeated at various temperatures in the range of 130° C. to 160° C. At any temperature, the material was developed and silver was deposited.

The light-sensitive layer developed at each temperature was peeled from the material, and the density of the deposited silver was measured. The results are set forth in Table 1.

EXAMPLES 2 to 7

The procedure of Example 1 was repeated except that each of the following non-reducing compounds was employed in place of the non-reducing compound (1) in the same amount. Each light-sensitive material thus produced was evaluated in the same manner as that described in Example 1. The results are set forth in Table 1.

(Non-reducing compound 2)

(Melting point: 145° C., Melting point of Mixture: 125° C.)

(Non-reducing compound 3)

(Melting point: 80° C., Melting point of Mixture: 78° C.)

(Non-reducing compound 4)

(Melting point: 114° C., Melting point of Mixture: 112° C.)

(Non-reducing compound 5)

(Melting point: 174° C., Melting point of Mixture: 162° C.)

(Non-reducing compound 6)

(Melting point: 170° C., Melting point of Mixture: 145° C.)

(Non-reducing compound 7)

(Melting point: 116° C., Melting point of Mixture: 101° C.)

COMPARISON EXAMPLE 1

In 80 g of 3 wt. % aqueous solution of polyvinyl alcohol (PVA-405, Kuraray Co., Ltd.), 20 g of powder of the reducing agent of Example 1 was dispersed by using a dynomill dispersing device, to prepare a reducing agent dispersion. The average particle size of the reducing agent was 0.9 μm.

The procedure of Example 1 was then repeated except that 1.3 g of the prepared reducing agent dispersion was employed in place of the dispersion of the mixture, to produce a light-sensitive material. The light-sensitive material thus produced was evaluated in the same manner as described in Example 1. The results are set forth in Table 1.

COMPARISON EXAMPLE 2

In 80 g of 3 wt. % aqueous solution of polyvinyl alcohol (PVA-405, Kuraray Co., Ltd.), 20 g of powder of the non-reducing compound (1) of Example 1 was dispersed by using a dynomill dispersing device, to prepare a non-reducing compound dispersion. The average particle size of the non-reducing compound (1) was 0.8 am.

After that, 0.65 g of the prepared non-reducing compound dispersion and 0.65 g of the reducing agent dispersion of Comparison Example 1 were mixed to prepare a mixed dispersion.

The procedure of Example 1 was then repeated except that the mixed dispersion was employed in place of the dispersion of the mixture, to produce a light-sensitive material. The light-sensitive material thus produced was evaluated in the same manner as that described in Example 1. The results are set forth in Table 1.

TABLE 1

| | NR* comp. | m.p.** depres. | Silver density | | | | | | |
|---|---|---|---|---|---|---|---|---|---|
| | | | 130° C. | 135° C. | 140° C. | 145° C. | 150° C. | 155° C. | 160° C. |
| Ex. 1 | (1) | 50° C. | 0.30 | 0.33 | 0.35 | 0.38 | 0.39 | 0.43 | 0.43 |
| Ex. 2 | (2) | 51° C. | 0.29 | 0.33 | 0.34 | 0.36 | 0.38 | 0.42 | 0.43 |
| Ex. 3 | (3) | 98° C. | 0.32 | 0.34 | 0.35 | 0.37 | 0.39 | 0.44 | 0.44 |
| Ex. 4 | (4) | 64° C. | 0.31 | 0.35 | 0.35 | 0.39 | 0.40 | 0.42 | 0.43 |
| Ex. 5 | (5) | 14° C. | 0.29 | 0.32 | 0.35 | 0.38 | 0.38 | 0.40 | 0.41 |
| Ex. 6 | (6) | 31° C. | 0.30 | 0.33 | 0.34 | 0.37 | 0.39 | 0.42 | 0.42 |
| Ex. 7 | (7) | 75° C. | 0.31 | 0.34 | 0.35 | 0.36 | 0.38 | 0.39 | 0.39 |
| CE. 1 | none | 0° C. | 0.27 | 0.30 | 0.32 | 0.31 | 0.34 | 0.34 | 0.40 |
| CE. 2 | (1)*** | 0° C. | 0.27 | 0.29 | 0.34 | 0.33 | 0.35 | 0.37 | 0.37 |

(Remarks)
NR comp.*: non-reducing compound
m.p. depres: depression of melting point In Comparison Example 2 (CE.2 (1)*), fine particles of the reducing agent and other fine particles of the non-reducing compound (1) were separately incorporated into the layer. Therefore, the melting point was not depressed.

EXAMPLE 8
Preparation of alkaline solution

The following alkaline solution was prepared and adjusted to pH 13.5.

| Alkaline solution | |
|---|---|
| 28 Wt. % aqueous solution of potassium silicate | 125.0 g |
| Potassium hydroxide | 15.0 g |
| Water | 750.0 g |

The silver halide light-sensitive material of Example 1 was exposed to light of 670 nm through a sharp cut interference filter. The light source was a xenon flush lump. The light emission time was $10^{-4}$ second. The exposure (energy on the surface) was 2 μJ per cm².

The aluminum support of the light-sensitive material was placed on a hot plate. The material was conveyed on the plate to heat the material for 30 seconds. Thus, the light-sensitive material was developed.

The light-sensitive material was washed with water to remove the image formation accelerating layer and the light-sensitive layer. The hardening layer was etched with the above alkaline solution with a brush in an automatic developing machine. The light-sensitive material was then well washed with water to form a blue polymer relief image within the exposed area of the hardening layer. The obtained image exhibited good contrast.

I claim:

1. A silver halide light-sensitive material comprising support, a hardening layer and a light-sensitive layer in order, said hardening layer containing an ethylenically unsaturated polymerizable compound or a cross-linkable polymer, and said light-sensitive layer containing silver halide and fine particles containing a reducing agent, wherein the fine particles are made of a mixture of the reducing agent and a non-reducing compound, said mixture having a melting point which is lower than a melting point of said reducing agent, and the difference between the melting points being not smaller than 10° C.

2. The silver halide light-sensitive material as claimed in claim 1, wherein the fine particles are mixed crystals of the reducing agent and the non-reducing compound.

3. The silver halide light-sensitive material as claimed in claim 1, wherein the reducing agent is a hydrazide.

4. The silver halide light-sensitive material as claimed in claim 1, wherein the non-reducing compound is an amide or an ester.

5. The silver halide light-sensitive material as claimed in claim 1, wherein the fine particles have an average particle size in the range of 0.01 to 10 μm.

6. The silver halide light-sensitive material as claimed in claim 1, wherein the silver halide light-sensitive material further comprises an image formation accelerating layer containing a base or a base precursor.

7. The silver halide light-sensitive material as claimed in claim 6, wherein the sliver halide light-sensitive material comprises the support, the hardening layer, the light-sensitive layer and the image formation accelerating layer in order.

* * * * *